United States Patent
Krishnamurthi

(10) Patent No.: US 10,911,005 B2
(45) Date of Patent: Feb. 2, 2021

(54) TRANSISTOR AMPLIFIER

(71) Applicant: BAE SYSTEMS INFORMATION AND ELECTRONIC SYSTEMS INTEGRATION INC., Nashua, NH (US)

(72) Inventor: Kathiravan Krishnamurthi, Westford, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 14 days.

(21) Appl. No.: 16/427,596

(22) Filed: May 31, 2019

(65) Prior Publication Data

US 2020/0382076 A1 Dec. 3, 2020

(51) Int. Cl.
 H03F 3/45 (2006.01)
 H03F 1/56 (2006.01)
 H03F 1/02 (2006.01)
 H03F 3/19 (2006.01)

(52) U.S. Cl.
 CPC ............. *H03F 1/56* (2013.01); *H03F 1/0205* (2013.01); *H03F 3/19* (2013.01)

(58) Field of Classification Search
 CPC .............................. H03F 3/45; H03F 2200/181
 USPC ......................................... 330/252, 276, 165
 See application file for complete search history.

(56) References Cited

U.S. PATENT DOCUMENTS

| | | | |
|---|---|---|---|
| 3,891,934 A | 6/1975 | Norton et al. | |
| 5,602,508 A * | 2/1997 | Endou | H03F 1/26 330/252 |
| 6,271,721 B1 | 8/2001 | Trask | |
| 8,121,579 B2 * | 2/2012 | Shiramizu | H03D 7/1433 455/334 |
| 2016/0056769 A1 * | 2/2016 | Takenaka | H03F 1/0222 330/253 |

OTHER PUBLICATIONS

Ichiro Aoki, et al, Distributed Active Transformer—A New Power-Combining and Impedance-Transformation Technique,IEEE Transactions on Microwave Theory and Techniques, Jan. 2002, pp. 316-331, vol. 50, No. 1.

* cited by examiner

*Primary Examiner* — Henry Choe
(74) *Attorney, Agent, or Firm* — Sand, Sebolt & Wernow LPA; Scott J. Asmus

(57) ABSTRACT

A transistor amplifier includes at least one differential pair of transistors and a plurality of transformers having a primary winding and a tapped secondary winding. The secondary winding is connected across emitters or sources of each transistor pair. The tap of each secondary has a current source. The primary windings of the plurality of transformers are connected in series. The transistor bases or gates are alternating current (AC) grounded. The collector or drain terminal pairs are connected in parallel. The transistor amplifier exhibits improved input impedance and improved linearity.

16 Claims, 4 Drawing Sheets

TRANSISTOR AMPLIFIER

TECHNICAL FIELD

The present disclosure relates to systems and methods for amplifier systems. More particularly, the present disclosure relates to transistor amplifiers. Specifically, the present disclosure relates to common base (CB) and common gate (CG) transistor amplifiers having improved input impedance and improved linearity.

BACKGROUND

Generally, a transistor amplifier is a semiconductor device used to amplify signals and electric power. Typical design parameters of transistor amplifiers include, but are not limited to, gain, power output, bandwidth, power efficiency, linearity, input impedance matching, output impedance matching, and heat dissipation.

One type of transistor amplifier is a bipolar junction transistor (BJT), which is a type of transistor that uses both electron and hole charge carriers. The BJT can be operated in different configurations, such, as, for example, a common emitter (CE) configuration and a common base (CB) configuration When the BJT is operating in the CE configuration, the input signal is applied between the base and the emitter, and the output is taken from between the collector and the emitter. Although the CE configuration is commonly used, a shortcoming associated with the CE configuration is that the CE configuration has low breakdown voltages, which are defined as voltages that cause the transistor to breakdown or cease normal operation. Another shortcoming associated with the CE configuration is that the CE configuration suffers from gain roll-off, which is a significant reduction of amplifier gain as frequency increases, due to the Miller Effect, which accounts for an increase in the equivalent input capacitance of an inverting voltage amplifier due to amplification of the effect of capacitance between the input and output terminals. Further, the coupling impedance in the CE configuration is a deleterious capacitance.

When the BJT is operating in the CB configuration, the base connection is common to both the input signal and the output signal. The input signal is applied between the base and emitter terminals of the transistor and the output signal is taken from between the base and the collector terminals. The base terminal is grounded or connected to a fixed reference voltage point. The CB configuration has larger breakdown voltages compared to the CE configuration and the CB configuration does not suffer from gain roll-off. However, one shortcoming associated with the CB configuration is that the CB configuration has a very low input impedance which leads to impedance matching issues. One solution to the very low input impedance issue of the CB configuration is to utilize a cascode amplifier, which includes a CE stage loaded by the emitter of a CB stage; however, cascode amplifiers require larger voltage supplies compared to a CB configuration by itself. Another solution to the very low input impedance of the CB configuration is to utilize feedback techniques, such as, for example, a feedback network; however, utilizing a feedback network results in instabilities at higher frequencies.

SUMMARY

There remains a need in the art for an improved transistor amplifier. The present disclosure addresses these and other issues.

In one aspect, an exemplary embodiment of the present disclosure may provide a common base (CB) transistor amplifier comprising a plurality of transformers; wherein each of the plurality of transformers includes a primary and a secondary; wherein each primary is connected in series; at least one differential pair of transistors; wherein each transistor of each of the at least one differential pair of transistors includes a base terminal, an emitter terminal, and a collector terminal; wherein one secondary of the plurality of transformers is connected across the emitter terminals of each of the transistors of each of the at least one differential pair of transistors; and wherein the collector terminals of each of the transistors of each of the at least one differential pair of transistors are connected in parallel.

In one example, the CB transistor amplifier may include a single-ended radio frequency (RF) input terminal connected to one primary of the plurality of transformers. In another example, the CB transistor amplifier may include a differential radio frequency (RF) input port having a first input terminal and a second input terminal; wherein the first input terminal is connected to one primary of the plurality of transformers; and wherein the second input terminal is connected to another primary of the plurality of transformers.

The CB transistor amplifier may include at least one current source providing a total current to the at least one differential pair of transistors. The total current may be split substantially equally between each transistor of each of the at least one differential pair of transistors. The CB transistor amplifier may include at least one RF input signal voltage source providing a total voltage to the at least one differential pair of transistors. The total voltage may be split substantially equally between each transistor of each of the at least one differential pair of transistors.

The CB transistor amplifier may include a radio frequency (RF) input port, an input impedance presented by the CB transistor amplifier, and an RF source impedance presented to the RF port. The input impedance presented by the CB transistor amplifier may be substantially matched to the RF source impedance.

The CB transistor amplifier may include a series emitter that increases the input impedance of the CB transistor amplifier. The CB transistor amplifier may include a primary center tap in the series connection of the plurality of transformers and a direct current (DC) supply connected to the primary center tap adapted to supply a pre-driver to the CB transistor amplifier.

In another aspect, an exemplary embodiment of the present disclosure may provide a common gate (CG) transistor amplifier comprising a plurality of transformers; wherein each of the plurality of transformers includes a primary and a secondary; wherein each primary is connected in series; at least one differential pair of transistors; wherein each transistor of each of the at least one differential pair of transistors includes a gate terminal, a source terminal, and a drain terminal; wherein one secondary of the plurality of transformers is connected across the source terminals of each of the transistors of each of the at least one differential pair of transistors; wherein the drain terminals of each of the transistors of each of the at least one differential pair of transistors are connected in parallel.

In one example, the CG transistor amplifier may include a single-ended radio frequency (RF) input terminal connected to one primary of the plurality of transformers. In another example, the CG transistor amplifier may include a differential radio frequency (RF) input port having a first input terminal and a second input terminal; wherein the first input terminal is connected to one primary of the plurality of transformers; and wherein the second input terminal is connected to another primary of the plurality of transformers.

The CG transistor amplifier may include at least one current source providing a total current to the at least one differential pair of transistors. The total current may be split substantially equally between each transistor of each of the at least one differential pair of transistors. The CG transistor amplifier may include at least one RF input signal voltage source providing a total voltage to the at least one differential pair of transistors. The total voltage may be split substantially equally between each transistor of each of the at least one differential pair of transistors.

The CG transistor amplifier may include a radio frequency (RF) input port, an input impedance presented by the CG transistor amplifier, and an RF source impedance presented to the RF port. The input impedance presented by the CG transistor amplifier may be substantially matched to the RF source impedance.

The CG transistor amplifier may include a series emitter that increases the input impedance of the CG transistor amplifier. The CG transistor amplifier may include a primary center tap in the series connection of the plurality of transformers and a direct current (DC) supply connected to the primary center tap adapted to supply a pre-driver to the CG transistor amplifier.

In yet another aspect, an exemplary embodiment of the present disclosure may provide a transistor amplifier including at least one differential pair of transistors and plurality of transformers having a primary winding and a tapped secondary winding. The secondary winding is connected across emitters or sources of each transistor pair. The tap of each secondary has a current source. The primary windings of the plurality of transformers are connected in series. The transistor bases or gates are alternating current (AC) grounded. The collector or drain terminal pairs are connected in parallel. The transistor amplifier exhibits improved input impedance and improved linearity.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

Figure 1:
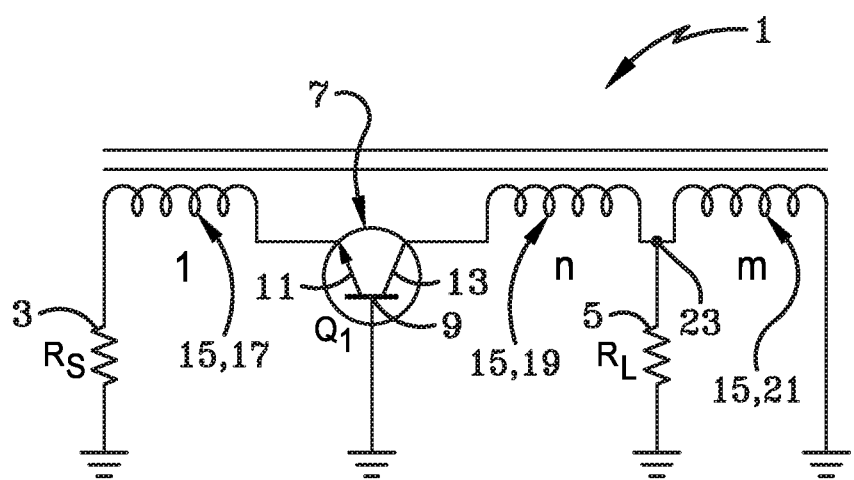
FIG. 1 is a schematic diagram of a PRIOR ART common base (CB) feedback amplifier, which may also be referred to as a Norton CB transistor amplifier.

FIG. 1 illustrates a schematic view of a PRIOR ART common base (CB) feedback amplifier 1, which may also be referred to as a "Norton CB transistor amplifier". The CB feedback amplifier 1 includes an input port 3, which may also be referred to as $R_S$ and an output port 5, which may also be referred to as $R_L$. The CB feedback amplifier 10 further includes a transistor 7, which may also be referred to as $Q_1$. The transistor $Q_1$ includes a base terminal 9, an emitter terminal 11, and a collector terminal 13. The base terminal 9 of the transistor $Q_1$ is alternating current (AC) grounded, and, therefore, the transistor $Q_1$ may be referred to as a common base (CB) transistor. The CB feedback amplifier 1 includes a transformer 15 having a first coil 17, a second coil 19, and a third coil 21. The first coil 17, the second coil 19, and the third coil 21 have a turns ratio of 1:n:m, respectively, and as shown in FIG. 1. The first coil 17, which may also be referred to as the primary winding, is connected between the emitter terminal 11 and the input port 3. The second coil 19 and the third coil 21 may be referred to as the secondary winding which includes a tap 23. The output terminal 5 is tapped at tap 23. The matching condition for input impedance with simultaneously load and source matching is equal to the following equation:

$$R_S = R_{in} = \frac{(m+n+1)R_L}{m^2}. \qquad \text{Equation (1)}$$

In operation, the PRIOR ART CB feedback amplifier 1 maintains the desirable characteristic of a CB configuration that is free from deleterious effects from the Miller effect deterioration at high frequency gain. Feedback from the output terminal 5 to the input terminal 3 via transformer 15 coupling increases the input impedance and also linearizes the PRIOR ART CB feedback amplifier 1. Very high input third order intercept points can also be obtained with the PRIOR ART CB feedback amplifier 1.

Figures 2, 3:
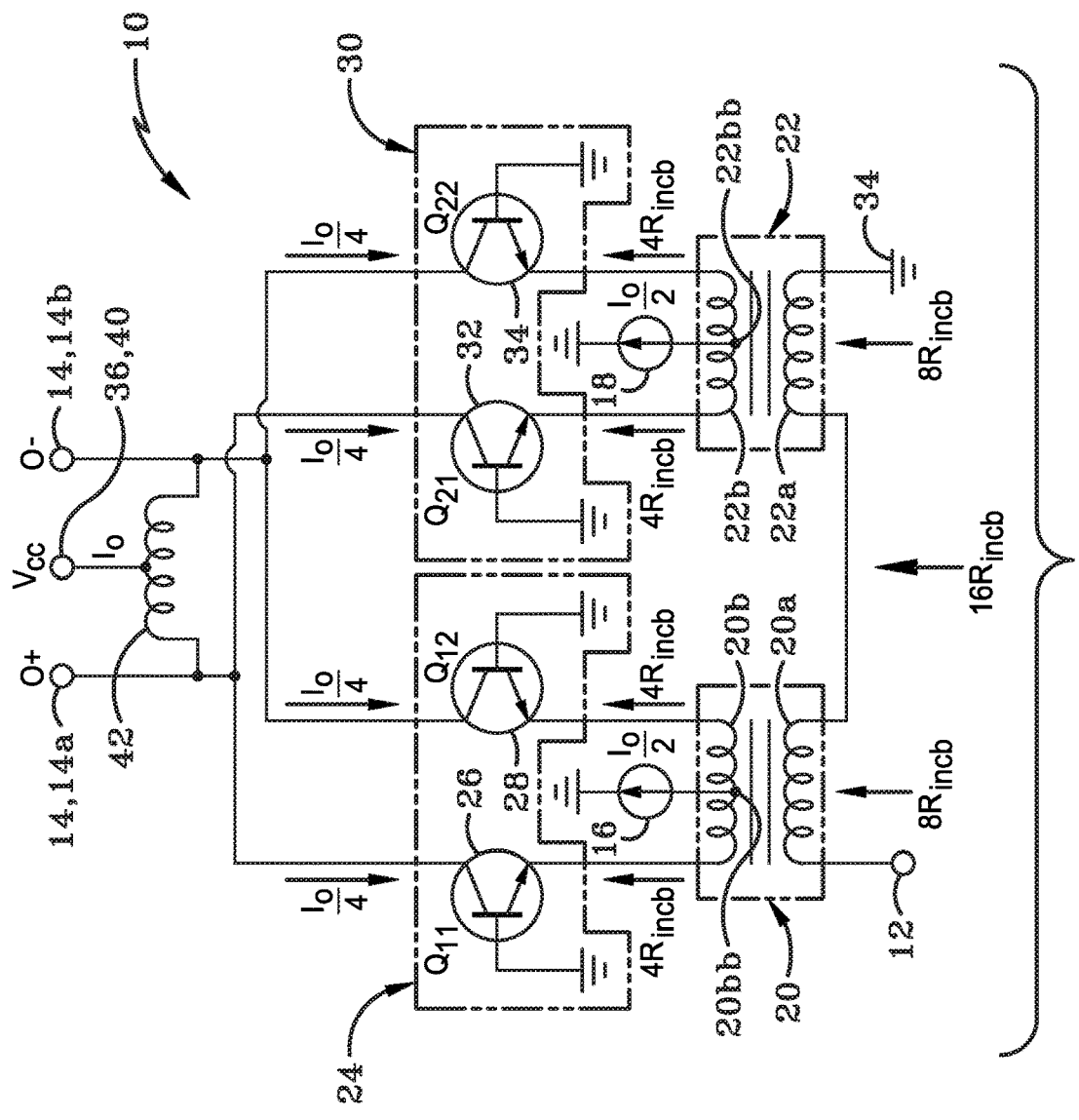
FIG. 2 is a schematic diagram of a PRIOR ART CB transistor amplifier.
FIG. 3 is a schematic view of a first embodiment of a two-cell CB transistor amplifier in accordance with one aspect of the present disclosure.

FIG. 2 is a schematic diagram of a PRIOR ART CB transistor amplifier 25. The PRIOR ART CB transistor amplifier 25 includes a current source 27 and a load mechanism 29. The PRIOR ART CB transistor amplifier 25 further includes a transistor $Q_{1a}$. Transistor $Q_{1a}$ includes a base terminal 31, an emitter terminal 33, and a collector terminal 35. The direct current (DC) current, which may also be referred to as $I_O$, flows through the collector terminal 35 and the DC current flowing through the emitter terminal 33 is assumed to be the same as the DC current flowing through the collector terminal 35. This assumption is valid for modern silicon transistors that have high current gain, where the base current is small compared to the collector current. The input resistance is given by the following equation:

$$R_{incb} = \frac{V_T}{I_o} + R_e \qquad \text{Equation (2)}$$

where $V_T$ is thermal voltage, which is kT/q, where k is Boltzmann's constant, T is temperature, and q is electronic charge. At room temperature, $V_T$ is approximately 26 millivolts (mV).

The PRIOR ART CB transistor amplifier 25 of FIG. 2 is a single-ended CB transistor amplifier. As shown in FIG. 2, the transistor $Q_{1a}$ is a base-grounded npn transistor. An input current, which may be referred to as $I_E$ is the sum of the output current, which may be referred to as $I_C$ and the base current, which may be referred to as $I_B$. As such, the output current $I_C$ is less than the input current which results in a current gain of unity or less. Stated otherwise, there is no current gain from the PRIOR ART CB transistor amplifier 25. All of the power gain of the PRIOR ART CB transistor amplifier 25 comes from the voltage gain and the output of the PRIOR ART CB transistor amplifier 25 has a large voltage swing. The input impedance of the PRIOR ART CB transistor amplifier 25 can be as low as one ohm (Ω) when the emitter resistance, which may be referred to as $R_E$ is equal to zero and the emitter DC current $I_O$ is equal to approximately twenty-six milliamps (mA). As one of ordinary skill in the art would understand, matching a fifty Ω RF source to an amplifier having such a low input impedance is difficult.

FIG. 3 is a schematic view of a first embodiment of a CB transistor amplifier 10, which may also be referred to as a two-cell CB transistor amplifier, in accordance with one aspect of the present disclosure. The CB transistor amplifier 10 includes a single-ended radio frequency (RF) input terminal 12, a differential voltage output terminal 14 having a first output terminal 14a and a second output terminal 14b a first current source 16, a second current source 18, a first transformer 20, a second transformer 22, a first differential pair of transistors 24 having a first transistor 26, which may also be referred to as $Q_{11}$ and a second transistor 28, which may also be referred to as $Q_{12}$, a second differential pair of transistors 30 having a third transistor 32, which may also be referred to as $Q_{21}$ and a fourth transistor 34, which may also be referred to as $Q_{22}$, a load mechanism 36, and a plurality of grounds 38. The first differential pair of transistors 24 may also be referred to as a first CB cell and the second differential pair of transistors 30 may also be referred to as a second CB cell. The CB transistor amplifier 10 may further include a series emitter $R_E$ that increases the input impedance of the CB transistor amplifier 10.

The first transformer 20 includes a primary 20a and a secondary 20b which includes a center tap 20bb. The second transformer 22 includes a primary 22a and a secondary 22b which includes a center tap 22bb. In one example, the first transformer 20 and the second transformer 22 are 1:1 planar transformers; however, any suitable transformers may be utilized, such as, for example, planar spiral transformers, wire-wound transformers, slab transformers, and the like. It should be noted that the selection of the type of transformers may be dependent, at least in part, on the desired operational frequencies of the CB transistor amplifier 10 of the present disclosure.

The first transistor $Q_{11}$ of the first differential pair of transistors 24, the second transistor $Q_{12}$ of the first differential pair of transistors 24, the third transistor $Q_{21}$ of the second differential pair of transistors 30 and the fourth transistor $Q_{22}$ of the second differential pair of transistors 30 are bipolar junction transistors (BJTs); however, the first transistor $Q_{11}$ of the first differential pair of transistors 24 and the second transistor $Q_{12}$ of the first differential pair of transistors 24, the third transistor $Q_{21}$ of the second differential pair of transistors 30, and the fourth transistor $Q_{22}$ of the second differential pair of transistors 30 may be any suitable transistors, including, but not limited to n-type field effect transistors (nFETs), pseudomorphic high-electron mobility transistors (pH EMTs), metal-semiconductor field-effect transistors (MESFETs) and gallium nitride (GaN) transistors.

The load mechanism 36 includes a voltage supply 40 and an inductor 42. Although a certain load mechanism 36 has been described, it is to be entirely understood that different load mechanisms may be utilized.

The primary 20a of the first transformer 20 is connected to RF input terminal 12 and the primary 22a of the second transformer 22 in series. The primary 22a of the second transformer 22 is connected to one of the plurality of grounds 38.

The secondary 20b of the first transformer 20 is connected to the emitter of the first transistor $Q_{11}$, the emitter of the second transistor $Q_{12}$, and the first current source 16 via center tap 20bb. The first current source 16 is connected to one of the plurality of grounds 38. The base of the first transistor $Q_{11}$ is connected to one of the plurality of grounds 38. The base of the second transistor $Q_{12}$ is connected to one of the plurality of grounds 38.

The secondary 22b of the second transformer 22 is connected to the emitter of the third transistor $Q_{21}$, the emitter of the fourth transistor $Q_{22}$, and the second current source 18 via center tap 22bb. The second current source 18 is connected to one of the plurality of grounds 38. The base of the third transistor $Q_{21}$ is connected to one of the plurality of grounds 38. The base of the fourth transistor $Q_{22}$ is connected to one of the plurality of grounds 38.

The collector of the first transistor $Q_{11}$ is connected to the collector of the third transistor $Q_{21}$ and the first output terminal 14a in parallel. The collector of the second transistor $Q_{12}$ is connected to the collector of the fourth transistor $Q_{22}$ and the second output terminal 14b in parallel. The inductor 42 is connected to the first output terminal 14a, the second output terminal 14b and the voltage supply 40.

In operation, an RF input signal voltage (not shown) is substantially equally split by the first transformer 20 and the second transformer 22 and fed to the first differential pair of transistors 24 and the second differential pair of transistors 30. The DC current $I_O$ is also substantially evenly split between the first transistor $Q_{11}$ of the first CB cell 24, the second transistor $Q_{12}$ of the first CB cell 24, the third transistor $Q_{21}$ of the second CB cell 30 and the fourth transistor $Q_{22}$ of the second CB cell 30 which increases the input impedance presented by the first transistor $Q_{11}$ of the first CB cell 24 and the second transistor $Q_{12}$ of the first CB cell 24 by a factor of four and increases the input impedance presented by the third transistor $Q_{21}$ of the second CB cell 30 and the fourth transistor $Q_{22}$ of the second CB cell 30 by a factor of four. Therefore, the input impedance presented by the first CB cell 24 increases by a factor of eight and the input impedance presented by the second CB cell 30 increases by a factor of eight. The input impedance for the CB transistor amplifier 10 can be calculated according to the following equation:

$$R_{incb2cell} = = \frac{16V_T}{I_o} + 4R_e. \qquad \text{Equation (3)}$$

While the input signal voltage is shared substantially evenly between the first CB cell 24 and the second CB cell 30, the output currents of the first CB cell 24 and the second CB cell 30 are combined by connecting the outputs of the first CB cell 24 and the second CB cell 30 together. This configuration decreases the output impedance of the first CB cell 24 and the second CB cell 30 to facilitate output matching. This is beneficial as the output impedance of a conventional CB configuration is typically high.

It should be noted that the CB transistor amplifier 10 has been described as having a single-ended RF input terminal 12 with the primary 22a of the second transformer 22 being connected to the at least one ground 38. By connecting one of the primaries of the transformers, such as the primary 22a of the second transformer 22a being connected to ground 38, forms an unbalanced to balanced CB transistor amplifier which may be used to directly drive a balanced mixer from a single-ended RF source.

Although the CB transistor amplifier 10 has been described as having a single-ended RF input terminal 12, it is to be entirely understood that the CB transistor amplifier 10 may have a differential RF input port having a first input terminal and a second input terminal. When the CB transistor amplifier 10 has a differential RF input port, the primary 20a of the first transformer 20 is connected to the first input terminal and the primary 22a of the second transformer in series and the primary 22a of the second transformer 22 is connected to the second input terminal. When the CB transistor amplifier 10 has a differential RF input port, the CB transistor amplifier 10 may be used to directly be driven by a differential RF source, such as, for example, a mixer, a multiplier, a dipole antenna, or any other suitable differential RF source.

Figure 4:
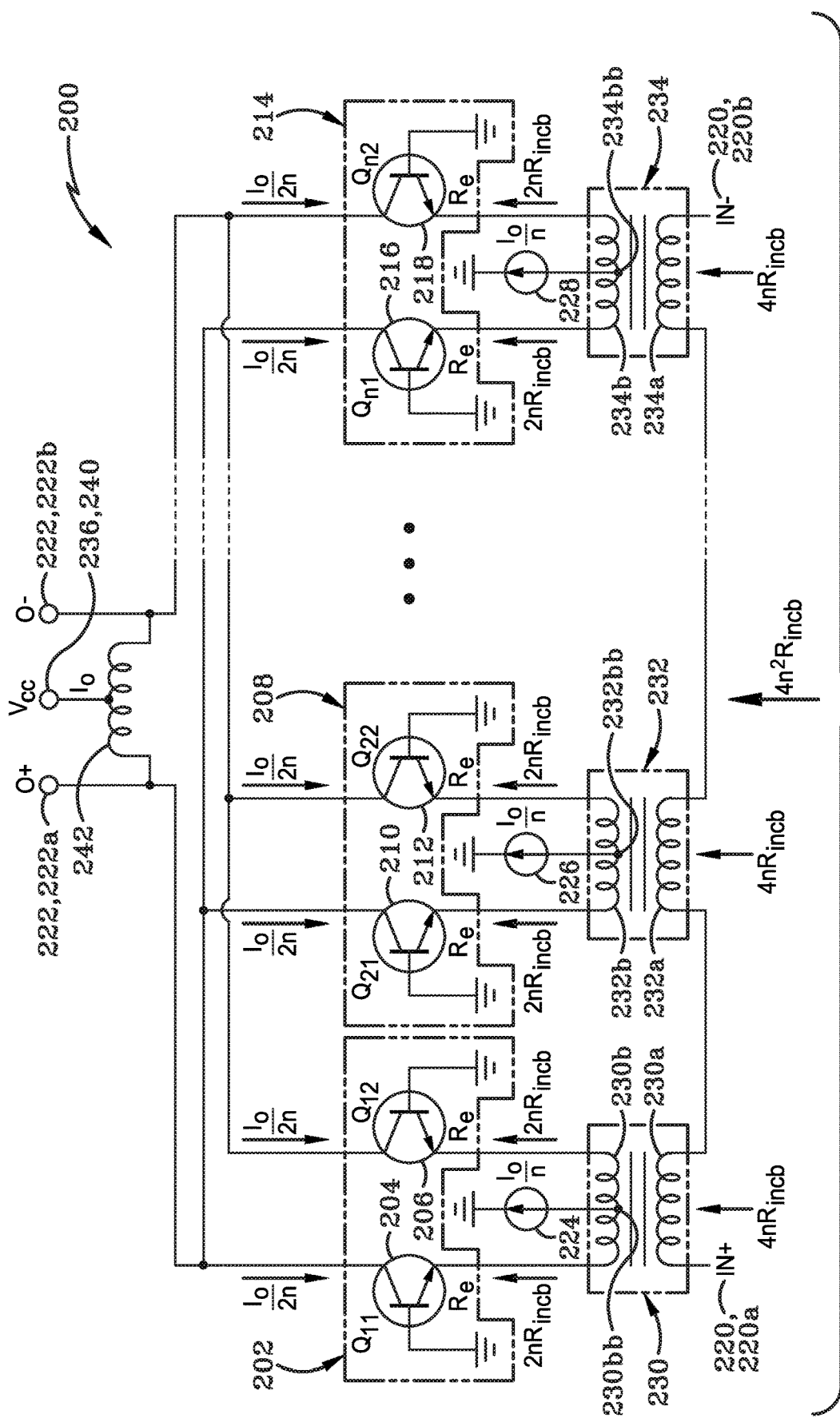
FIG. 4 is a schematic view of a second embodiment of a n-cell CB transistor amplifier in accordance with one aspect of the present disclosure.

FIG. 4 is a schematic view of a second embodiment of a CB transistor amplifier 200, which may also be referred to as an n-cell CB transistor amplifier, in accordance with one aspect of the present disclosure. CB transistor amplifier 200 is substantially identical to CB transistor amplifier 10 in structure and function with a few exceptions/additions that will be discussed hereafter in greater detail. Instead of having a first CB cell 24 and a second CB cell 30, the CB transistor amplifier 200 has n number of CB cells, where n is any suitable integer. As such, and as shown in FIG. 4, the CB transistor amplifier 200 includes a first CB cell 202 having a first transistor 204, which may also be referred to as $Q_{11}$ and a second transistor 206, which may also be referred to as $Q_{12}$, a second CB cell 208 having a third transistor 210, which may also be referred to as $Q_{21}$ and a fourth transistor 212, which may also be referred to as $Q_{22}$, and an nth CB cell 214 having a first nth transistor 216, which may also be referred to as $Q_{n1}$ and a second nth transistor 218, which may also be referred to as $Q_{n2}$. Further, instead of having a singled-ended RF input terminal, the CB transistor amplifier 200 includes a differential RF input terminal 220 having a first input terminal 220a and a second input terminal 220b. CB transistor amplifier 200 further includes a differential voltage output terminal 222 having a first output terminal 222a and a second output terminal 222b, a first current source 224, a second current source 226, an nth current source 228, where n is any suitable integer, a first transformer 230, a second transformer 232, an nth transformer 234, where n is any suitable integer, a load mechanism 236, and a plurality of grounds 238. The CB transistor amplifier 200 may further include a series emitter $R_E$ that increases the input impedance of the CB transistor amplifier 200.

The first transformer 230 includes a primary 230a and a secondary 230b which includes a center tap 230bb. The second transformer 232 includes a primary 232a and a secondary 232b which includes a center tap 232bb. The nth transformer 234 includes a primary 234a and a secondary 234b which includes a center tap 234bb. In one example, the first transformer 230, the second transformer 232, and the third transformer 234 are 1:1 planar transformers; however, any suitable transformers may be utilized, such as, for example, planar spiral transformers, wire-wound transformers, slab transformers, and the like. It should be noted that the selection of the type of transformers may be dependent, at least in part, on the desired operational frequencies of the CB transistor amplifier 200 of the present disclosure.

The first transistor $Q_{11}$ of the first CB cell 202, the second transistor $Q_{12}$ of the first CB cell 202, the third transistor $Q_{21}$ of the second CB cell 208, the fourth transistor $Q_{22}$ of the second CB cell 208, the first nth transistor 216 of the nth CB cell 214, and the second nth transistor 218 of the nth CB cell 214 are bipolar junction transistors (BJTs); however, the first transistor $Q_{11}$ of the first CB cell 202, the second transistor $Q_{12}$ of the first CB cell 202, the third transistor $Q_{21}$ of the second CB cell 208, the fourth transistor $Q_{22}$ of the second CB cell 208, the first nth transistor 216 of the nth CB cell 214, and the second nth transistor 218 of the nth CB cell 214 may be any suitable transistors, including, but not limited to n-type field effect transistors (nFETs), pseudomorphic high-electron mobility transistors (pHEMTs), metal-semiconductor field-effect transistors (MESFETs) and gallium nitride (GaN) transistors.

The load mechanism 236 includes a voltage supply 240 and an inductor 242. Although a certain load mechanism 236 has been described, it is to be entirely understood that different load mechanisms may be utilized.

The primary 230a of the first transformer 230 is connected to the first RF input terminal 220a and the primary 232a of the second transformer 232 in series. The primary 232a of the second transformer 232 is connected to the primary 234a of the nth transformer 234 and the primary 234a of the nth transformer 234 is connected to the second RF input terminal 220b.

The secondary 230b of the first transformer 230 is connected to the emitter of the first transistor $Q_{11}$, the emitter of the second transistor $Q_{12}$, and the first current source 224 via center tap 230bb. The first current source 16 is connected to one of the plurality of grounds 238. The base of the first transistor $Q_{11}$ is connected to one of the plurality of grounds 238. The base of the second transistor $Q_{12}$ is connected to one of the plurality of grounds 238.

The secondary 232b of the second transformer 232 is connected to the emitter of the third transistor $Q_{21}$, the emitter of the fourth transistor $Q_{22}$, and the second current source 226 via center tap 232bb. The second current source 226 is connected to one of the plurality of grounds 238. The base of the third transistor $Q_{21}$ is connected to one of the plurality of grounds 238. The base of the fourth transistor $Q_{22}$ is connected to one of the plurality of grounds 238.

The secondary 234b of the nth transformer 234 is connected to the emitter of the first nth transistor $Q_{n1}$, the emitter of the second nth transistor $Q_{n2}$, and the third current source 228 via center tap 234b. The second current source 228 is connected to one of the plurality of grounds 238. The base of the first nth transistor $Q_{n1}$ is connected to one of the plurality of grounds 238. The base of the second nth transistor $Q_{n2}$ is connected to one of the plurality of grounds 238.

The collector of the first transistor $Q_{11}$, the collector of the third transistor $Q_{21}$, the collector of the first nth transistor $Q_{n1}$, and the first output terminal 222a are connected to one another in parallel. The collector of the second transistor $Q_{21}$, the collector of the fourth transistor $Q_{22}$, the collector of the second nth transistor $Q_{n2}$, and the second output terminal 222b are connected to one another in parallel. The inductor 242 is connected to the first output terminal 222a, the second output terminal 222b, and the voltage supply 240.

In operation, an RF input signal voltage (not shown) is substantially evenly split by the first transformer 230, the second transformer 232, and the nth transformer 234 and fed to the first CB cell 202, the second CB cell 208, and the nth CB cell 214. The DC current $I_O$ is also substantially evenly split between the first transistor $Q_{11}$ of the first CB cell 202, the second transistor $Q_{12}$ of the first CB cell 202, the third transistor $Q_{21}$ of the second CB cell 208, the fourth transistor $Q_{22}$ of the second CB cell 208, the first nth transistor 216 of the nth CB cell 214, and the second nth transistor 218 of the nth CB cell 214 which increases the input impedance presented by the first transistor $Q_{11}$ of the first CB cell 202 and the second transistor $Q_{12}$ of the first CB cell 202 by a factor of 2n, increases the input impedance presented by the third transistor $Q_{21}$ of the second CB cell 208 and the fourth transistor $Q_{22}$ of the second CB cell 208 by a factor of 2n, and increases the input impedance presented by the first nth transistor 216 of the nth CB cell 214 and the second nth transistor 218 of the nth CB cell 214 by a factor of 2n. Therefore, the input impedance presented by the first CB cell 202, the second CB cell 208, and the nth CB cell 214 each increase by a factor of 4n. The input impedance for the CB transistor amplifier 200 can be calculated according to the following equation:

$$R_{incbncell} = \frac{4n^2 V_T}{I_0} + 2nR_e. \qquad \text{Equation (4)}$$

While the input signal voltage is shared substantially evenly between the first CB cell 202, the second CB cell 208, and the nth CB cell 214, the output currents of the first CB cell 202, the second CB cell 208, and the nth CB cell 214 are combined by connecting the outputs of the first CB cell 202, the second CB cell 208, and the nth CB cell 214 together. This configuration decreases the output impedance of the first CB cell 202, the second CB cell 208, and the nth CB cell 214 to facilitate output matching. This is beneficial as the output impedance of a conventional CB configuration is typically high.

It should be noted that the CB transistor amplifier 200 has been described as having a differential RF input terminal 220 having a first input terminal 220a and a second input terminal 220b with the primary 230a of the first transformer 230 being connected to the first RF input terminal 220a and the primary 232a of the second transformer 232 in series, the primary 232a of the second transformer 232 being connected to the primary 234a of the nth transformer 234, and the primary 234a of the nth transformer 234 being connected to the second RF input terminal 220b. This configuration allows the CB transistor amplifier 200 to be used to directly driven by a differential RF source, such as, for example, a mixer, a multiplier, a dipole antenna, or any other suitable differential RF source.

Although the CB transistor amplifier 200 has been described as having a differential RF input terminal 220 having a first input terminal 220a and a second input terminal 220b, it is to be entirely understood that the CB transistor amplifier 200 may have a single-ended RF input terminal. When the CB transistor amplifier 200 has a single-ended RF input terminal, the primary 220a of the first transformer 220 is connected to the single-ended input terminal and the primary 222a of the second transformer 222 in series and the primary 222a of the second transformer 222 is connected to ground. When the CB transistor amplifier 200 has a single-ended RF input terminal, the CB transistor amplifier 200 may be used to directly drive a balanced mixer from a single-ended RF source.

In addition to the improved input impedance matching capability of the CB transistor amplifier 200, signal splitting between the first CB cell 202, the second CB cell 208, and the nth CB cell 214 also increases the input intercept point (IP3) compared to the PRIOR ART CB feedback amplifier 1 and the PRIOR ART CB transistor amplifier 25. The IP3 represents how efficiently a transistor amplifier processes signals without distortion. In other words, the IP3 is a figure of merit for a RF/microwave radio component. The IP3 also represents how much of a range, for example, power in milliwatts or dBms, that the component is able to suitably process without distortion. Only a small portion of the input drive, which is A_RF/n, excites each individual CB cell, 202, 208, and 214 of the CB transistor amplifier 200. This is described by a transfer function in accordance with the following equation:

$$V_{cbno} = R_L I_o \sinh\left[\frac{A_{RF}\cos(\omega_{RF}t)}{2nV_T}\right] \qquad \text{Equation (5)}$$

where $A_{RF} \cos(\omega_{RF}t)$ is the sinusoidal input to the CB transistor amplifier 200, and $A_{RF}$ is the voltage amplitude. The expression is an odd function of the input voltage and results only in odd order harmonics. This is one of the advantages of the CB transistor amplifier 200 of the present disclosure. The output voltage produced by Equation (5) can be expanded via a Taylor series, which is a representation of a function as an infinite sum of terms that are calculated from the values of the function's derivatives at a single point, and the third order input intercept point voltage, $V_{IP3}$, of the CB transistor amplifier 200 according to the following equation:

$$V_{IP3} = 4n\sqrt{2}V_T \qquad \text{Equation (6).}$$

Figure 5:
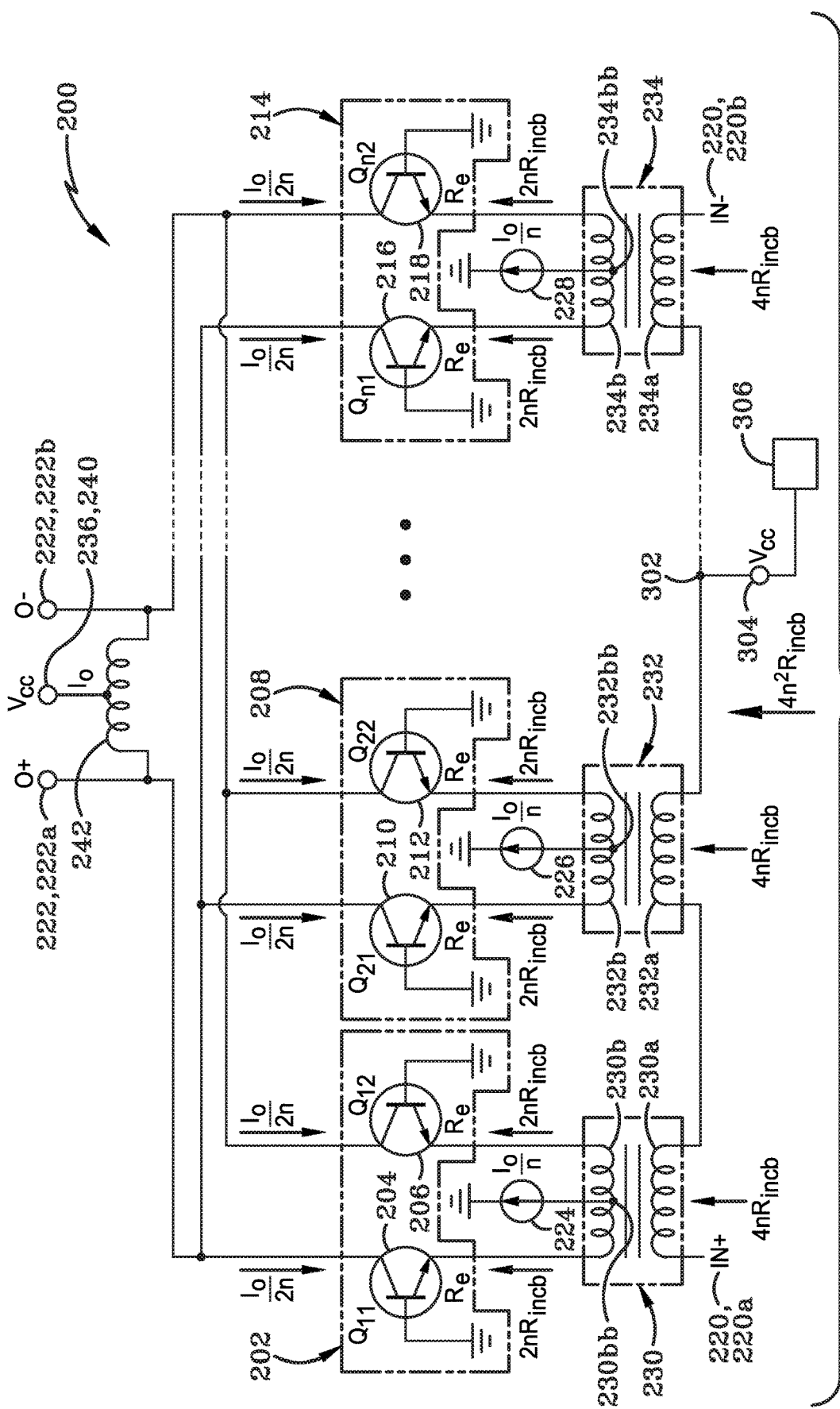
FIG. 5 is a schematic view of a third embodiment of a n-cell CB transistor amplifier in accordance with one aspect of the present disclosure.

FIG. 5 is a schematic view of a second embodiment of a CB transistor amplifier 300, which may also be referred to as an n-cell CB transistor amplifier, in accordance with one aspect of the present disclosure. CB transistor amplifier 300 is substantially identical to CB transistor amplifier 200 in structure and function with a few exceptions/additions that will be discussed hereafter in greater detail. CB transistor 300 further includes a primary center tap 302 in the series connection of the first transformer 230, the second transformer 232, and the nth transformer 234 and a direct current (DC) supply 304 connected to the primary center tap 302 adapted to supply a pre-driver 306 to the CB transistor amplifier 300.

Although the CB transistor amplifier 10, the CB transistor amplifier 200, and the CB transistor amplifier 300 have been described as utilizing BJTs, it is to be understood that the teachings of the present disclosure may be applied equally to other types of transistors, such as, for example, FETs. As such, it is to be entirely understood that the gate terminals, source terminals, and drain terminals may be connected in a similar manner to the connections of the base terminals, emitter terminals, and collector terminals of the CB transistors 10, 200, and 300.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A common base (CB) transistor amplifier comprising:
   a plurality of transformers; wherein each of the plurality of transformers includes a primary and a secondary; wherein each primary is connected in series;
   at least one differential pair of transistors; wherein each transistor of each of the at least one differential pair of transistors includes a base terminal, an emitter terminal, and a collector terminal; wherein one secondary of the plurality of transformers is connected across the emitter terminals of each of the transistors of each of the at least one differential pair of transistors; and wherein the collector terminals of each of the transistors of each of the at least one differential pair of transistors are connected in parallel; and
   a single-ended radio frequency (RF) input terminal connected to one primary of the plurality of transformers.

2. The CB transistor amplifier of claim 1, further comprising:
   at least one current source providing a total current to the at least one differential pair of transistors.

3. The CB transistor amplifier of claim 2, wherein the total current is split substantially equally between each transistor of each of the at least one differential pair of transistors.

4. The CB transistor amplifier of claim 1, further comprising:
   at least one RF input signal voltage source providing a total voltage to the at least one differential pair of transistors.

5. The CB transistor amplifier of claim 4, wherein the total voltage is split substantially equally between each transistor of each of the at least one differential pair of transistors.

6. The CB transistor amplifier of claim 1, further comprising:
   a radio frequency (RF) input port;
   an input impedance presented by the CB transistor amplifier; and
   an RF source impedance presented to the RF port; wherein the input impedance presented by the CB transistor amplifier is substantially matched to the RF source impedance.

7. The CB transistor amplifier of claim 6, further comprising:
   a series emitter that increases the input impedance of the CB transistor amplifier.

8. The CB transistor amplifier of claim 1, further comprising:
   a primary center tap in the series connection of the plurality of transformers; and
   a direct current (DC) supply connected to the primary center tap adapted to supply a pre-driver to the CB transistor amplifier.

9. A common gate (CG) transistor amplifier comprising:
   a plurality of transformers; wherein each of the plurality of transformers includes a primary and a secondary; wherein each primary is connected in series; and
   at least one differential pair of transistors; wherein each transistor of each of the at least one differential pair of transistors includes a gate terminal, a source terminal, and a drain terminal; wherein one secondary of the plurality of transformers is connected across the source terminals of each of the transistors of each of the at least one differential pair of transistors; wherein the drain terminals of each of the transistors of each of the at least one differential pair of transistors are connected in parallel;
   a radio frequency (RF) input port;
   an input impedance presented by the CG transistor amplifier; and
   an RF source impedance presented to the RF port; wherein the input impedance presented by the CG transistor amplifier is substantially matched to the RF source impedance; and
   a series emitter that increases the input impedance of the CG transistor amplifier.

10. The CG transistor amplifier of claim 9, further comprising:
    a single-ended radio frequency (RF) input terminal connected to one primary of the plurality of transformers.

11. The CG transistor amplifier of claim 9, wherein:
the RF input port is a differential radio frequency (RF) input port having a first input terminal and a second input terminal; wherein the first input terminal is connected to one primary of the plurality of transformers; and wherein the second input terminal is connected to another primary of the plurality of transformers.

12. The CG transistor amplifier of claim 9, further comprising:
at least one current source providing a total current to the at least one differential pair of transistors.

13. The CG transistor amplifier of claim 12, wherein the total current is split substantially equally between each transistor of each of the at least one differential pair of transistors.

14. The CG transistor amplifier of claim 9, further comprising:
at least one RF input signal voltage source providing a total voltage to the at least one differential pair of transistors.

15. The CG transistor amplifier of claim 14, wherein the total voltage is split substantially equally between each transistor of each of the at least one differential pair of transistors.

16. The CG transistor amplifier of claim 9, further comprising:
a primary center tap in the series connection of the plurality of transformers; and
a direct current (DC) supply connected to the primary center tap adapted to supply a pre-driver to the CG transistor amplifier.

* * * * *